(12) United States Patent
Lin et al.

(10) Patent No.: US 8,664,018 B2
(45) Date of Patent: Mar. 4, 2014

(54) MANUFACTURING METHOD FOR LED PACKAGE

(75) Inventors: Hsin-Chiang Lin, Hsinchu (TW); Wen-Liang Tseng, Hsinchu (TW); Chieh-Ling Chang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 72 days.

(21) Appl. No.: 13/290,144

(22) Filed: Nov. 7, 2011

(65) Prior Publication Data

US 2012/0214264 A1 Aug. 23, 2012

(30) Foreign Application Priority Data

Feb. 21, 2011 (CN) .......................... 2011 1 0040687

(51) Int. Cl.
*H01L 21/00* (2006.01)

(52) U.S. Cl.
USPC .............................................. 438/27; 438/29

(58) Field of Classification Search
None
See application file for complete search history.

(56) References Cited

U.S. PATENT DOCUMENTS

| | | | | |
|---|---|---|---|---|
| 6,756,731 B1 * | 6/2004 | Sano | ............... | 313/499 |
| 6,759,266 B1 * | 7/2004 | Hoffman | .................... | 438/64 |
| 7,649,209 B2 * | 1/2010 | Hussell et al. | .................. | 257/98 |
| 7,910,938 B2 * | 3/2011 | Hussell et al. | .................. | 257/98 |
| 7,968,900 B2 * | 6/2011 | Hussell et al. | .................. | 257/99 |
| 8,167,674 B2 * | 5/2012 | Hussell et al. | .................. | 445/23 |
| 8,362,512 B2 * | 1/2013 | Hussell et al. | .................. | 257/99 |
| 8,390,022 B2 * | 3/2013 | Hussell et al. | .................. | 257/99 |
| 8,425,271 B2 * | 4/2013 | Hussell et al. | .................. | 445/23 |
| 2004/0012027 A1 * | 1/2004 | Keller et al. | .................... | 257/79 |
| 2004/0217692 A1 * | 11/2004 | Cho et al. | ....................... | 313/503 |
| 2006/0068154 A1 * | 3/2006 | Parce et al. | ..................... | 428/76 |
| 2007/0262339 A1 * | 11/2007 | Hussell et al. | .................. | 257/99 |
| 2007/0287208 A1 * | 12/2007 | Thompson et al. | ............. | 438/26 |
| 2008/0054279 A1 * | 3/2008 | Hussell et al. | .................. | 257/95 |
| 2008/0054284 A1 * | 3/2008 | Hussell et al. | .................. | 257/98 |
| 2008/0173883 A1 * | 7/2008 | Hussell et al. | .................. | 257/98 |
| 2009/0057698 A1 * | 3/2009 | Okamura et al. | ............... | 257/98 |
| 2009/0153022 A1 * | 6/2009 | Hussell et al. | .................. | 313/503 |
| 2009/0221783 A1 | 9/2009 | Hawker et al. | | |
| 2009/0267484 A1 * | 10/2009 | Kasakura et al. | ............ | 313/502 |
| 2010/0090233 A1 * | 4/2010 | Hussell et al. | .................. | 257/89 |
| 2011/0149604 A1 * | 6/2011 | Hussell et al. | ................. | 362/612 |
| 2011/0204400 A1 * | 8/2011 | Koizumi et al. | ................ | 257/98 |
| 2012/0091487 A1 * | 4/2012 | Chan et al. | ....................... | 257/98 |
| 2012/0104428 A1 * | 5/2012 | Hussell et al. | .................. | 257/89 |
| 2012/0206039 A1 * | 8/2012 | Hussell et al. | ................ | 313/512 |
| 2012/0214264 A1 * | 8/2012 | Lin et al. | .......................... | 438/27 |
| 2012/0235192 A1 * | 9/2012 | Lin et al. | .......................... | 257/98 |

FOREIGN PATENT DOCUMENTS

EP 2071636 A1 6/2009
WO WO2009028861 A2 3/2009

* cited by examiner

*Primary Examiner* — David E Graybill
(74) *Attorney, Agent, or Firm* — Altis Law Group, Inc.

(57) ABSTRACT

The disclosure provides a manufacturing method for an LED package. A first luminescent conversion layer comprising one first luminescent conversion element is located on an LED chip, wherein the first luminescent conversion element is precipitated via centrifugation around the LED chip without sheltering the LED chip. Thereafter, a second luminescent conversion layer is located on the first luminescent conversion layer. The second luminescent layer has a second luminescent conversion element which has an excited efficiency lower that that of the first luminescent conversion element.

12 Claims, 7 Drawing Sheets

MANUFACTURING METHOD FOR LED PACKAGE

TECHNICAL FIELD

The disclosure relates generally to manufacturing method for light emitting diode (LED) package, and more particularly to a manufacturing method of LED package using centrifugation.

DESCRIPTION OF THE RELATED ART

LEDs have become more popular due to their low power consumption, high efficiency, quick reaction time and long life and the fact that LEDs contain no mercury. Conventionally, the LED package may include one LED chip and multiple luminescent conversion elements, such as green, blue and red luminescent conversion elements, to increase color rendering property. However, different luminescent conversion elements have various excited efficiencies. For instance, the excited efficiency of red luminescent conversion element or nitride phosphor is lower than green luminescent conversion element or nitroxides phosphor. If red and green luminescent conversion elements are assembled in one LED package at the same time and are excited by one light source, the LED package may emit more green light than red light during operation. This leads to decreased color uniformity and a reduction in quality.

DETAILED DESCRIPTION

Exemplary embodiments of the disclosure will now be described with reference to the accompanying drawings.

Figure 1:
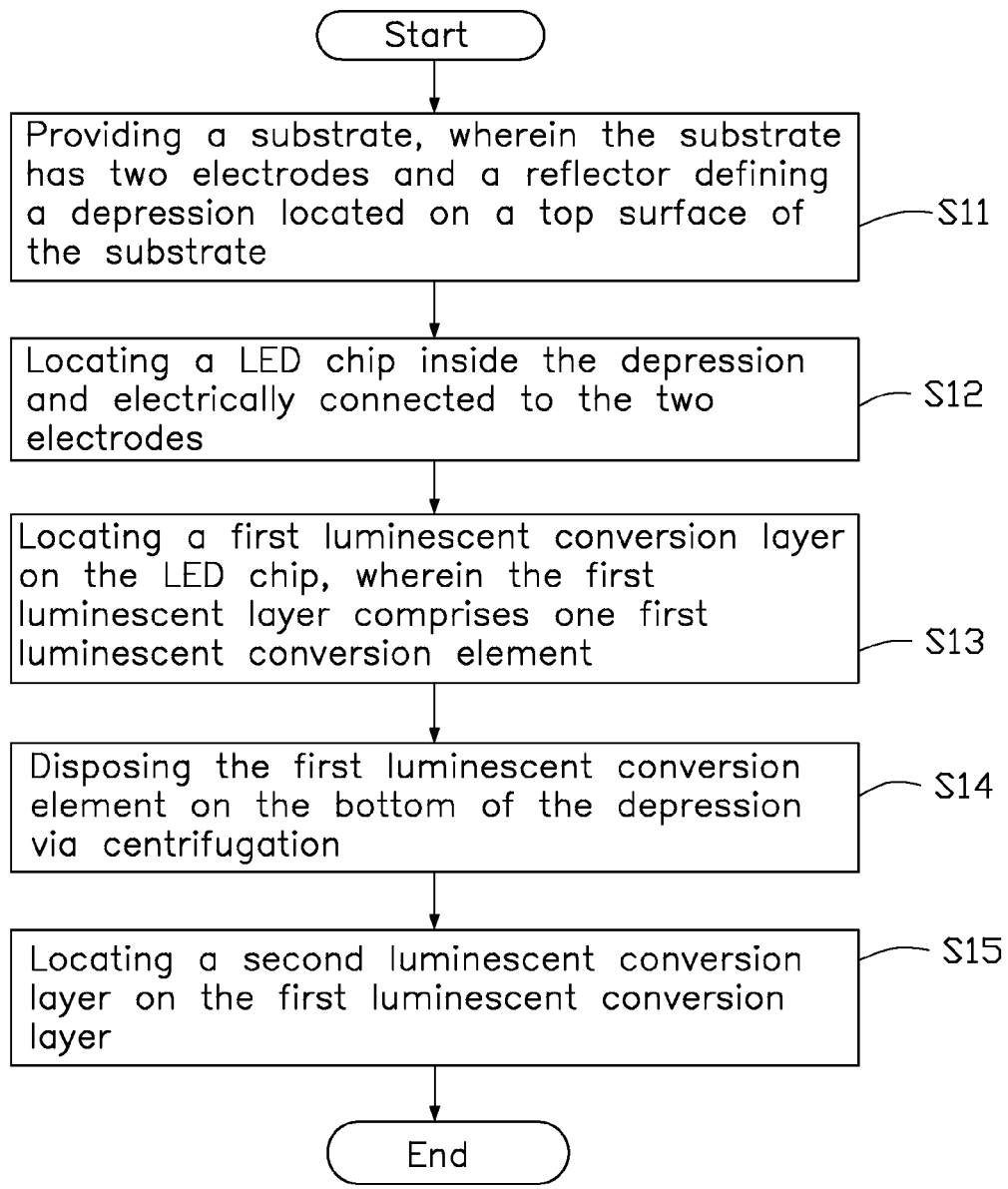
FIG. 1 is a flow chart showing a manufacturing method for an LED package of the disclosure.

Referring to FIG. 1, a manufacturing method for an LED package includes the following steps.

Figure 2:
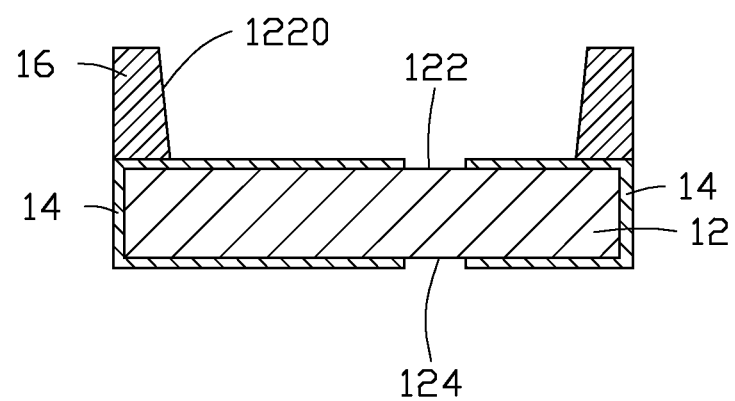
FIG. 2 is a cross section showing a step of providing a substrate in accordance with the method of FIG. 1.

In step S11 and FIG. 2, a substrate 12 is provided, wherein the substrate 12 comprises two electrodes 14 and a reflector 16 defining a depression 1220 located on a top surface 122 of the substrate 12. In the disclosure, the reflector 16 is located around the fringe of the top surface 122 and covers a portion of the two electrodes 14. Additionally, a bottom surface 124 of the substrate 12 is located opposite to the top surface 122. The two electrodes 14 comprise a cathode and an anode respectively extending from the top surface 122 to the bottom surface 124.

In step S12, an LED chip 18 is located inside the depression 1220 and electrically connects to the two electrodes 14. In the disclosure, the LED chip 18 is capable of emitting blue light or ultraviolet (UV) and via conductive wires electrically connects to the two electrodes 14 on the top surface 122.

Figure 3:
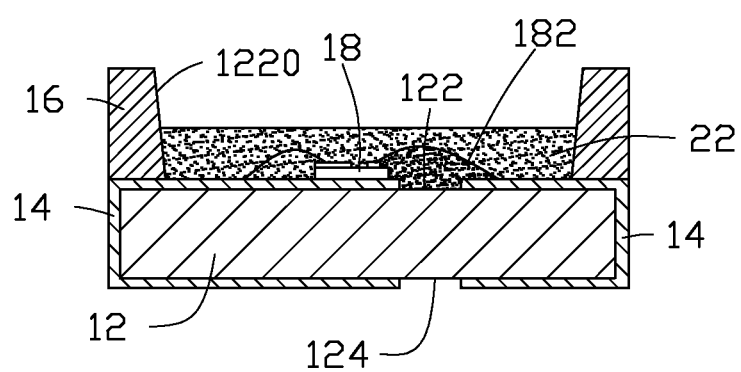
FIG. 3 is a cross section showing a first embodiment of a step of locating a first luminescent conversion layer on the substrate in accordance with the method of FIG. 1.
Figure 4:
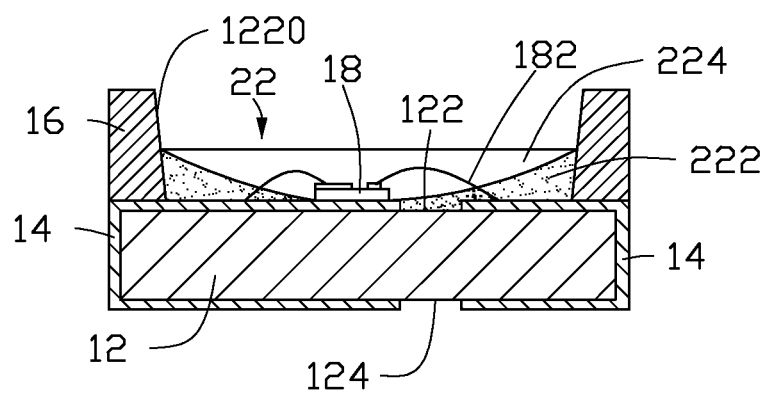
FIG. 4 is a cross section showing a step of disposing the first luminescent conversion layer via centrifugation in accordance with the method of FIG. 1.

In step S13 and FIG. 3, a first luminescent conversion layer 22 is located on the LED chip 18, wherein the first luminescent conversion layer 22 comprises one first luminescent conversion element 222 (labeled in FIG. 4). In this embodiment, the first luminescent conversion layer 22 is a hybrid comprising one first transparent colloid 224 mixed with the first luminescent conversion element 222 (labeled in FIG. 4). Moreover, the first luminescent conversion element 222 can be green luminescent conversion element made by nitroxides, sulfides or silicates.

In step S14 and FIG. 4, the first luminescent conversion element 222 inside the first luminescent conversion layer 22 is precipitated on the bottom of the depression 1220 via centrifugation. In the content, before the first luminescent conversion layer 22 located on the LED chip 18 is completely cured, the first luminescent conversion element 222 is suspended full of the first luminescent conversion layer 22. After the centrifugation, the first luminescent conversion element 222 is precipitated on the bottom of the reflector 16 and extends to the inner surface of the depression 1220 to form a concave camber. Moreover, the first transparent colloid 224 is centralized in the midst of the first luminescent conversion layer 22.

Figure 5:
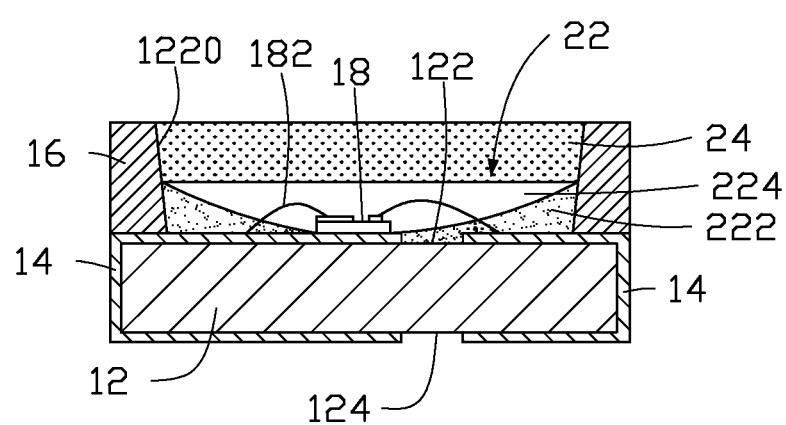
FIG. 5 is a cross section showing a step of locating a second luminescent conversion layer on the first luminescent conversion layer in accordance with the method of FIG. 1.

In step S15 and FIG. 5, a second luminescent conversion layer 24 is located on the first luminescent conversion layer 22. In the disclosure, the second luminescent conversion layer 24 is also a hybrid, which comprises one second luminescent conversion element (not labeled) and one second transparent colloid (not labeled) mixed with each other. Moreover, the second luminescent conversion element can be red luminescent conversion element made by nitrides, sulfides or silicates. In this embodiment, the excited efficiency of the second luminescent conversion element is lower than the first luminescent conversion element 222.

According to foresaid description, the first luminescent conversion element 222 is disposed around the LED chip 18 without sheltering the LED chip 18 and the first transparent colloid 224 is located just upon the LED chip 18. Hence, light emitted from the LED chip 18 in the forward direction is more intensive than other directions and the forward direction light can directly excite the second luminescent conversion element through the first transparent colloid 224. Moreover, by the excited efficiency of the second luminescent conversion element lower than the first luminescent conversion element 222 and, the intensity of the excited light emitted from the second luminescent conversion element is substantially equal to the first luminescent conversion element 222. Therefore, the LED package with high color rendering property of the disclosure is provided due to lower excited efficiency of the luminescent conversion element is enhanced. In this embodiment, the LED chip 18 emits blue light, the first luminescent conversion element can be green luminescent conversion element and the second luminescent conversion element can be red luminescent conversion element, such that the LED package can provide blue, green and red light uniformly at the same time with high color rendering property.

Figure 6:
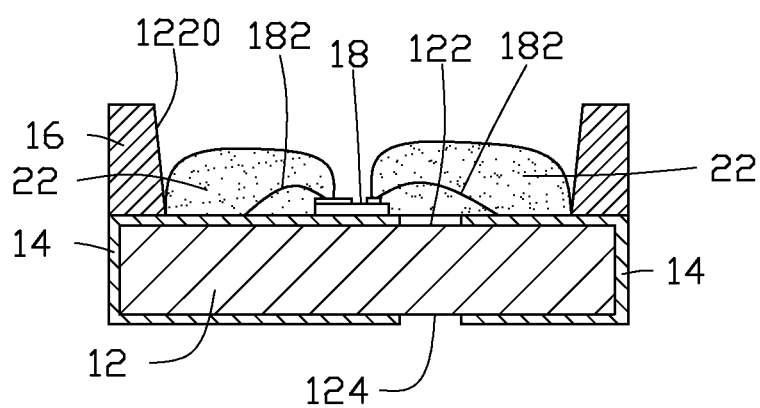
FIG. 6 is a cross section showing a second embodiment of a step of locating a first luminescent conversion layer on the substrate in accordance with the method of FIG. 1.

For disposing the first luminescent conversion element 222 around the LED chip 18 without sheltering the LED chip 18, a second embodiment of locating a first luminescent conversion layer 22 on the LED chip 18 is provided. In the second embodiment as shown in FIG. 6, the first luminescent conversion layer 22 is composed of two stacks respectively located on two conductive wires 182 between the LED chip 18 and the two electrodes 14. In this embodiment, the two stacks of the first luminescent conversion layer 22 are located separately. Thereafter, the first luminescent conversion element 222 inside the first luminescent conversion layer 22 is precipitated on the bottom of the reflector 16 by centrifugation and extends to the inner surface of the depression 1220 to form a concave camber as shown in FIG. 4.

Figure 7:
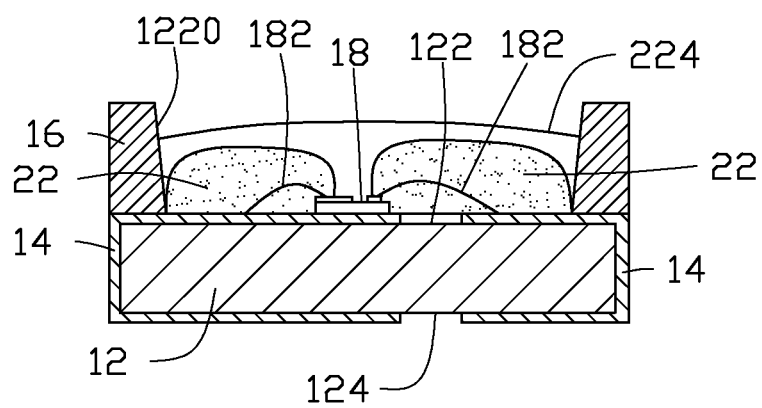
FIG. 7 is a cross section showing a step of locating a third transparent colloid on the first luminescent conversion layer in accordance with FIG. 6.

Referring to FIG. 7, the disclosure also provides a third embodiment which is similar to the second embodiment, the only difference is that a third transparent colloid 224 is disposed upon the two stacks of the first luminescent conversion layer 22, after the two stacks of the first luminescent conversion layer 22 are disposed separately. Thus, speed of precipitating the first luminescent conversion element 222 is enhanced.

According to the disclosure, the first luminescent conversion layer 22 and the second luminescent conversion layer 24 are located separately, wherein the first luminescent conversion element 222 inside the first luminescent conversion layer 22 is precipitated on the bottom of the reflector 16 via centrifugation. Hence, light emitted from the LED chip 18 in the forward direction is more intensive than the other directions and emits directly to the second luminescent conversion element inside the second luminescent conversion layer 24. Moreover, the excited efficiency of the second luminescent conversion element is enhanced and high color rendering property of LED package is provided.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A manufacturing method for an LED package, comprising:
    providing a substrate, wherein the substrate has two electrodes and a reflector defining a depression located on a top surface of the substrate;
    locating an LED chip inside the depression and electrically connected to the two electrodes;
    locating a first luminescent conversion layer on the LED chip, wherein the first luminescent conversion layer comprises one first luminescent conversion element;
    precipitating the first luminescent conversion element on the bottom of the depression via centrifugation, the first luminescent conversion layer being a mixture comprising a first transparent colloid mixed with the first luminescent conversion element, after the centrifugation, the first luminescent conversion element being precipitated to form a concave camber on the bottom of the depression and the first transparent colloid being centralized in the midst of the first luminescent conversion layer; and
    locating a second luminescent conversion layer on the first luminescent conversion layer, the second luminescent conversion layer being a mixture comprising a second luminescent conversion element and a second transparent colloid;
    wherein an excitation efficiency of the second luminescent conversion element is lower than an excitation efficiency of the first luminescent conversion element.

2. The manufacturing method for the LED package as claimed in claim 1, wherein the two electrodes comprises a cathode and an anode respectively extending from the top surface to a bottom surface of the substrate.

3. The manufacturing method for the LED package as claimed in claim 1, wherein the LED chip is capable of emitting blue light or ultraviolet, and electrically connects to the two electrodes via conductive wires respectively.

4. The manufacturing method for the LED package as claimed in claim 1, wherein the first luminescent conversion element comprises green luminescent conversion element made by nitroxides, sulfides or silicates.

5. The manufacturing method for the LED package as claimed in claim 1, wherein the second luminescent conversion element comprises red luminescent conversion element selected from nitrides, sulfides or silicates.

6. The manufacturing method for the LED package as claimed in claim 1, wherein the first luminescent conversion layer is composed of two stacks respectively located on two connections between the LED chip and the two electrodes, and the two stacks of the first luminescent conversion layer are disposed separately.

7. The manufacturing method for the LED package as claimed in claim 6, wherein a third transparent colloid is disposed upon the two stacks of the first luminescent conversion layer.

8. A manufacturing method for an LED package, comprising:
    providing a substrate, wherein the substrate has two electrodes and a reflector defining a depression located on a top surface of the substrate;
    locating an LED chip inside the depression and electrically connected to the two electrodes;
    locating a first luminescent conversion layer on the LED chip, wherein the first luminescent conversion layer is composed of two stacks respectively located on two connections between the LED chip and the two electrodes, the first luminescent conversion layer comprises one first luminescent conversion element;
    precipitating the first luminescent conversion element on the bottom of the depression via centrifugation, the first luminescent conversion layer being a mixture comprising a first transparent colloid mixed with the first luminescent conversion element, after the centrifugation, the first luminescent conversion element being precipitated to form a concave camber on the bottom of the depression and the first transparent colloid being centralized in the midst of the first luminescent conversion layer; and
    locating a second luminescent conversion layer on the first luminescent conversion layer, the second luminescent conversion layer being a mixture comprising a second luminescent conversion element and a second transparent colloid mixed with each other;
    wherein an excitation efficiency of the second luminescent conversion element is lower than an excitation efficiency of the first luminescent conversion element.

9. The manufacturing method for the LED package as claimed in claim 8, wherein a third transparent colloid is disposed on the two stacks of the first luminescent conversion layer before the centrifugation.

10. The manufacturing method for the LED package as claimed in claim 8, wherein the two electrodes comprises a cathode and an anode respectively extending from the top surface to a bottom surface of the substrate.

11. The manufacturing method for the LED package as claimed in claim 8, wherein the first luminescent conversion element comprises green luminescent conversion element made by nitroxides, sulfides or silicates.

12. The manufacturing method for the LED package as claimed in claim 8, wherein the second luminescent conversion element comprises red luminescent conversion element selected from nitrides, sulfides or silicates.

* * * * *